United States Patent [19]

Stuart

[11] Patent Number: 5,427,452

[45] Date of Patent: Jun. 27, 1995

[54] RUGGED QUICK-RESPONSE THERMOCOUPLE FOR USE IN EVALUATING GAS GENERANTS AND GAS GENERATORS

[75] Inventor: Russell Stuart, Brigham City, Utah

[73] Assignee: Thiokol Corporation, Ogden, Utah

[21] Appl. No.: 179,146

[22] Filed: Jan. 10, 1994

[51] Int. Cl.⁶ .................... G01K 1/14; G01K 7/04; G01K 13/02; H01L 35/08

[52] U.S. Cl. .................... 374/179; 374/148; 136/230

[58] Field of Search .............. 136/230; 374/148, 179

[56] References Cited

U.S. PATENT DOCUMENTS

| | | | |
|---|---|---|---|
| 2,412,564 | 12/1946 | Current | 136/230 |
| 2,414,370 | 1/1947 | Floyd | 374/148 |
| 2,445,159 | 7/1948 | Tegge | 136/230 |
| 2,525,439 | 10/1950 | Abbott | 136/230 |
| 2,761,005 | 8/1956 | Chamberlain et al. | 136/230 |
| 2,870,233 | 1/1959 | Comer | 374/179 |
| 3,007,990 | 11/1961 | Ihnat | 136/230 |
| 3,205,296 | 9/1965 | Davis et al. | 136/230 |
| 3,283,580 | 11/1966 | Nanigian et al. | 136/230 |
| 3,376,169 | 4/1968 | Davis et al. | 136/230 |
| 3,416,972 | 12/1968 | Haselton et al. | 136/230 |
| 3,451,861 | 6/1969 | Gordon et al. | 136/230 |
| 3,589,192 | 6/1971 | Sabovik | 136/230 |
| 4,217,463 | 8/1980 | Sweapingen | 374/179 |
| 4,484,018 | 11/1984 | McLynn | 136/233 |
| 5,166,468 | 11/1992 | Atkeson | 102/207 |

FOREIGN PATENT DOCUMENTS 1150396  4/1969  United Kingdom ............... 374/148

OTHER PUBLICATIONS

Omega Engineering, Inc., Omega Complete Temperature Measurement Handbook & Encyclopedia, vol. 28, 1992., pp. A5, A6, A77, A35 Robe selection/Application Guide pp., A-94, C-12, Z-120, Z-160, A-7 and OMEGACLAD® Thermocouple wire page.

*Primary Examiner*—Diego F. F. Gutierrez
*Attorney, Agent, or Firm*—Madson & Metcalf; Ronald L. Lyons

[57] ABSTRACT

A rugged quick-response thermocouple for use in measuring the temperature of a gas flow includes two wires formed of different metals and electrically joined at an exposed junction. A ceramic sheath substantially surrounds the two wires except near the junction. The sheath is surrounded by a stainless steel tube. The junction is positioned adjacent an end of the ceramic sheath. In one embodiment the wires are coated with an insulator and the insulator is positioned against the flat end of the sheath. The exposed junction resists damage from gas flows and from corrosive compounds in the gas mixture.

16 Claims, 2 Drawing Sheets

RUGGED QUICK-RESPONSE THERMOCOUPLE FOR USE IN EVALUATING GAS GENERANTS AND GAS GENERATORS

FIELD OF THE INVENTION

The present invention relates to a rugged quick-response thermocouple for use in testing the temperature of a hot gas flow, and more particularly to a thermocouple that may be used repeatedly to measure temperatures within flows of hot gas produced by gas generants suitable for use in automobile air bag inflators.

TECHNICAL BACKGROUND OF THE INVENTION

When properly designed and implemented, automobile air bag restraint devices can dramatically reduce the injury and loss of life caused by automobile collisions. A properly deployed air bag may cushion a driver or passenger, thereby reducing the risk of injury. Proper air bag deployment includes rapidly inflating the air bag to a volume sufficient to cushion the occupant. Air bag inflator elements and their design and operation are described in the commonly owned and copending application for Method and System for Evaluating Gas Generants and Gas Generators, Attorney Docket No. 1090.2.105, which is incorporated herein by reference.

Gas bags are typically inflated principally by combustion of a chemical gas generant, but the gas generant may also be used in conjunction with other inflator elements. As the gas generant combusts, it produces gases which rapidly increase both the temperature and pressure within the air bag. The inflation must be rapid, so that the inflated air bag is in place in time to protect the occupant. Inflation typically occurs within about ten milliseconds of the time the gas generant begins combusting.

The temperature of the inflating gas flow is a significant design factor for several reasons. The gas is separated from the car's occupant only by the inflated air bag, and is also typically vented into the car's interior as the air bag deflates after use. Thus, the temperature must be low enough to avoid burning the car's occupants. The air bag must also be pressurized sufficiently to absorb the impact of an occupant. But adjustments in pressure may cause changes in temperature, and vice versa according to well-known physical laws, so both temperature and pressure readings are useful in designing inflators.

Gas temperatures may be measured with a thermocouple. A thermocouple is a temperature sensor that includes two different metals joined together at a junction. The junction produces a small thermoelectric voltage when the junction is heated. The metals may be electrically connected to a thermocouple thermometer that interprets the change in voltage as a change in temperature. A thermocouple placed in a housing for use as a temperature probe is known as a thermocouple probe.

Two methods are known for increasing the rapidity with which a thermocouple responds to changes in temperature. First, the junction between the two metals may be exposed to the ambient environment. Protected junctions are less subject to corrosion or structural stresses, but respond more slowly than exposed junctions.

Second, the amount of each metal used may be reduced. For instance, thermocouples are typically made by joining two wires at a junction and electrically connecting the other end of each wire to the thermocouple thermometer. Smaller wires have faster response times.

Exposed junction thermocouples having small wires may respond quickly enough to be useful in measuring temperatures at millisecond intervals, or at similar intervals of interest in evaluating gas bag inflators. However, small unprotected wires do not stand up well to the gas flows present in gas bag generators caused by combustion of gas generants as the generator pressure increases from about 100 pounds per square inch to as high as about 2500 pounds per square inch. A gas flow may tear the junction apart or tear the junction off of the thermocouple probe. Corrosive compounds from the gas flow may be deposited on the exposed junction.

Whether the junction is exposed or not, additional stresses are often presented when the probe is inserted into or removed from a typical gas bag inflator test apparatus. The probe is disposed with the junction located inside a closed container that holds the gas generant. The other end of the probe, which is connectable to the thermocouple thermometer, is positioned out side the container. The probe is clamped about its circumference at a location between these two ends to obtain an air-tight seal that prevents gas flow from escaping the gas generator. Small unprotected wires in the probe are easily damaged when the probe is moved or when it is clamped.

Thermocouples may be strengthened by enclosing the junction or by using larger wires, but either approach substantially increases the thermocouple's response time. If the response time is too great, the probe becomes useless. For instance, a probe with a response time measured in tenths of a second has little value in measuring gas flow temperatures at one-millisecond intervals.

Thus, it would be an advancement in the art to provide a rugged thermocouple that responds rapidly to temperature changes.

It would also be an advancement to provide such a thermocouple having a junction that is sufficiently rugged to withstand repeated exposure to the gas flow in a gas bag inflator.

It would be an additional advancement to provide such a thermocouple having a junction that responds to temperature changes rapidly enough to measure the gas flow temperature at a plurality of distinct times during a gas bag inflator test.

It would be a further advancement in the art to provide such a thermocouple which is sufficiently rugged to survive normal handling in a lab during gas bag inflator tests without losing effectiveness as a measuring instrument.

Such a thermocouple is disclosed and claimed herein.

BRIEF SUMMARY OF THE INVENTION

The present invention provides a thermocouple for use in measuring the temperature of a gas flow. The thermocouple includes two wires, each formed of a different metal. The wires are electrically joined to one another at an exposed junction. Each of the wires has a diameter near the junction no greater than about ten thousandths of an inch, and preferably no greater than about three thousandths of an inch. Exposure of the junction and use of small wires shortens the response time of the junction, making the thermocouple sufficiently responsive to temperature trends for use in obtaining gas bag ignitor gas flow temperatures about once per millisecond or more frequently.

The thermocouple also includes an electrically insulating sheath made of ceramic material. To improve the thermocouple's durability, the junction is positioned adjacent to one end of the sheath. Positioning the junction adjacent the sheath assists the thermocouple in resisting gas flow pressures that would otherwise break the wires or separate the wires from one another at the junction. The thermocouple is configured to provide useful temperature measurements from within the gas flow for periods of up to about sixty milliseconds while the gas flow has a temperature in the range from about 300 degrees Kelvin to the melting point of thermocouple wires or at most up to about 2800 degrees Kelvin and exerts a pressure against the junction of up to about 2500 pounds per square inch.

The sheath substantially surrounds the two wires except near the junction, thereby maintaining the wires in electrical separation from one another except at the junction, and also providing the wires with structural support. However, the ceramic sheath is brittle and subject to stress when the probe is moved or clamped during testing, so the sheath is preferably surrounded by a rigid tube such as a length of stainless steel tubing.

In one embodiment, the wires themselves are positioned against the end of the ceramic sheath. The wires are twist welded, so a portion of the junction extends into the gas flow beyond the portion of the wires parallel to the end of the sheath. In an alternative embodiment the wires are coated with an insulator and the insulator is positioned against the end of the ceramic sheath.

Embodiments using insulated wires also inhibit corrosion of the junction. The junction is held above the end of the ceramic sheath by the insulator on the wires, so gas may pass freely between the junction and the sheath. The scrubbing action and flow of the gas about the junction reduce the risk that corrosive compounds from the gas mixture will be deposited on the junction.

These and other features and advantages of the present invention will become more fully apparent through the following description and appended claims taken in conjunction with the accompanying drawings.

BRIEF DESCRIPTION OF THE DRAWINGS

In order that the manner in which the above-recited and other advantages and features of the invention are obtained, a more particular description of the invention summarized above will be rendered by reference to the appended drawings. Understanding that these drawings only provide a selected embodiment of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Reference is now made to the figures wherein like parts are referred to by like numerals. The present invention relates to a thermocouple such as that generally designated at 10 in FIG. 1. The thermocouple 10 includes two wires 12 and 14. Each wire 12, 14 comprises a different metal. In an embodiment for use in testing gas output of an inflator at the point where the gas would enter a pressure tank or an air bag the wires 12, 14 comprise a type K thermocouple employing nickel-chromium or nickel-aluminum thermocouple wires such as those available from Omega Engineering, Inc. of Stamford, Conn. In one embodiment for use in testing gas generants by measuring a gas flow emerging from a combustion chamber, the wires 12, 14 comprise a 0.005 inch diameter type C thermocouple employing tungsten-rhenium thermocouple wires, such as those available from Omega Engineering, Inc. It will be appreciated by those of skill in the art that other thermocouples, such as type J and type E thermocouples, may also be employed according to the teachings of the present invention and the temperature range of the gas flow to be measured.

Figure 2:
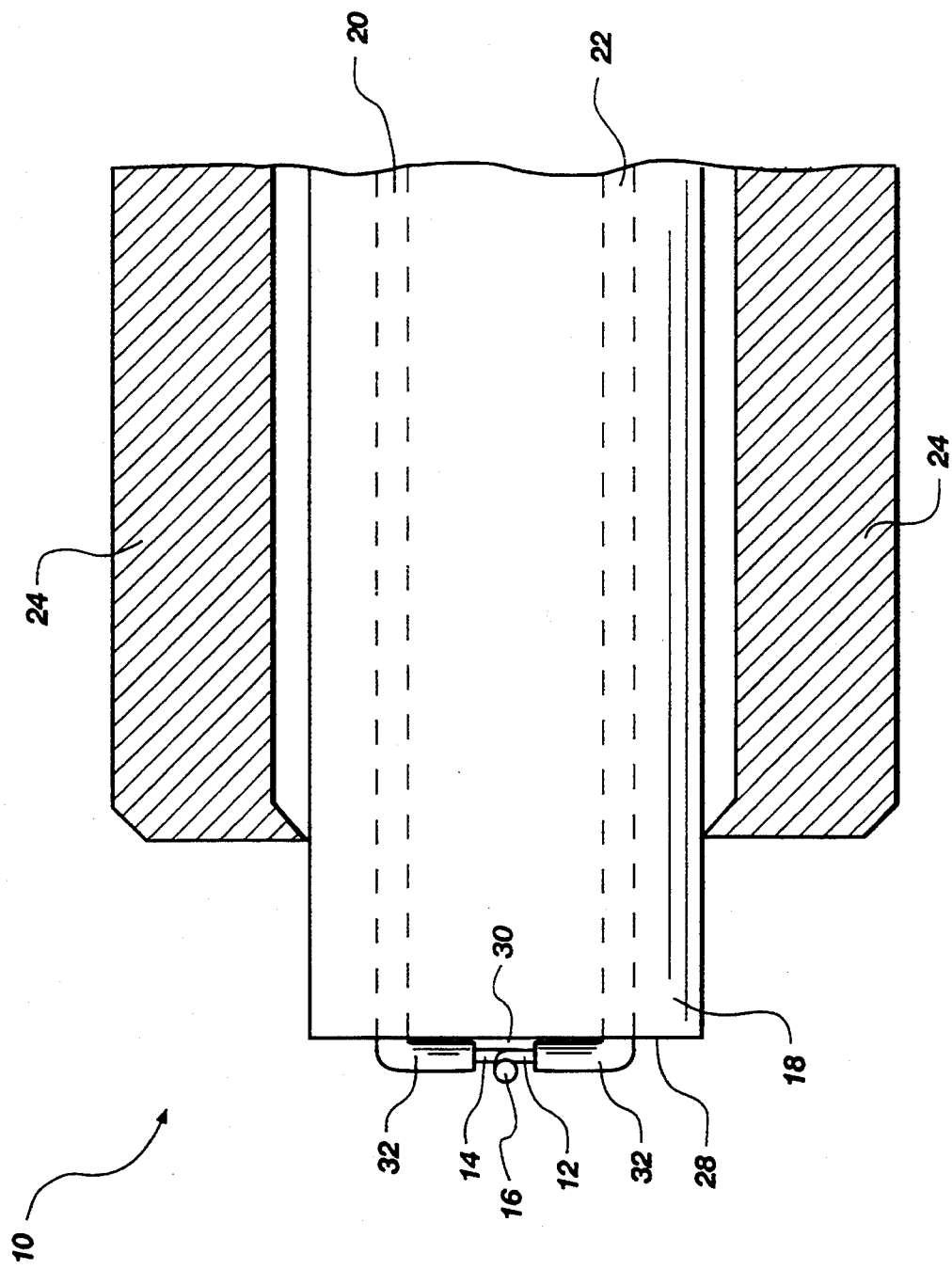
FIG. 2 is an enlarged view of the region enclosed by circled Arrow A in FIG. 1, further illustrating the position of the junction.

The wires 12, 14 are electrically joined to one another at an exposed junction 16, shown best in FIG. 2. The junction 16 is exposed to the ambient environment, including the gas flow whose temperature is being measured. The junction 16 may be formed by twist welding, butt welding, or other means. Twist welding is employed in a present embodiment because butt welding equipment was unavailable. After the wires 12, 14 are twisted together and the excess wire is removed, the junction 16 is dipped in a mercury bath to weld the wires 12, 14 together in conventional fashion. The mercury bath has a conventional silicon oil cover to reduce the release of mercury from the bath.

Twist welding provides structural strength at the junction, as integral ends of the wires 12, 14 are wrapped around each other. However, it is contemplated that butt welding may be preferable in circumstances where response time must be reduced. Butt welding provides a smaller bead size at the junction, and substantially the entire junction must be heated before the thermocouple responds to the heat increase.

Each of the wires 12, 14 has a diameter near the junction 16 no greater than about ten thousandths of an inch, and preferably no greater than about three thousandths of an inch. Exposing the junction 16 and using wires 12, 14 having diameters less than about ten thousandths of an inch enhances the thermal responsiveness of the junction 16. Enclosed junctions are not preferred, because they respond to temperature changes too slowly to be useful in measuring gas bag inflator gas flow temperatures. Likewise, wires greater than about ten thousandths of an inch in diameter are more rugged, but respond too slowly to temperature changes.

The thermocouple 10 also includes an electrically insulating sheath 18. The sheath 18 has two bores 20, 22 for receiving the wires 12, 14. The sheath 18 substantially surrounds the wires 12, 14 except within a connector 38 and near the junction 16 where the wires 12, 14 emerge from the sheath 18. Thus, the wires 12, 14 are maintained in electrical separation from one another except at the junction 16. The sheath 18 may be made of a ceramic material such as an impervious, recrystallized, pure alumina ceramic or a mullite type ceramic available from Omega Engineering, Inc.

Figure 1:
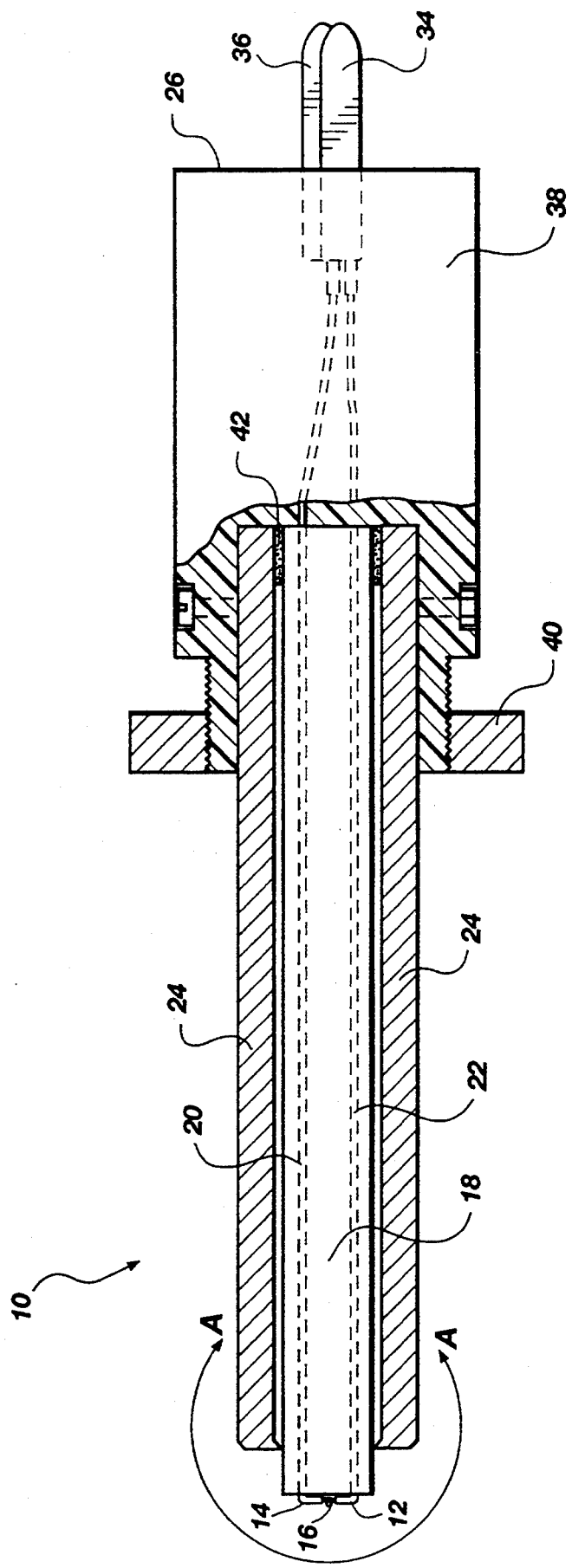
FIG. 1 is a partial cut-away view of a thermocouple illustrating an exposed junction, sheath, tube, connector, and other elements of the invention.

As illustrated in FIG. 1, the sheath 18 provides some structural support for the wires 12, 14. However, in practice the ceramic sheath 18 is somewhat brittle. If unprotected, the sheath 18 may crack or chip when subjected to stresses during routine handling in the lab.

For instance, the probe 10 is stressed when the probe 10 is clamped to provide an air-tight seal during testing. Thus, the sheath 18 is preferably enclosed in a rigid tube 24. The tube 24 may be a length of stainless steel tubing, such as ¼" by 0.049 wall 304 stainless steel tubing. The tube 24 and the sheath 18 are secured to each other at each end of the tube 24. The end of the tube 24 near the junction 16 is crimped against the sheath as shown, and the tube 24 is bonded by a standard epoxy 42 to the sheath 18.

As illustrated in FIG. 1, the thermocouple wires 12, 14, the sheath 18, and the tube 24 are cut to lengths appropriate for use in a particular test apparatus. The lengths should be generally as short as possible, to avoid reductions in probe responsiveness. However, the probe 10 should be long enough to permit placement of the junction 16 inside the gas bag inflator container near or in the path of the gas flow being measured with the opposite end 26 of the probe 10 placed outside the gas bag inflator container.

The wires 12, 14 are electrically connected to two prongs 34, 36 of a connector 38 at the end 26 of the probe 10 opposite the junction 16. The wires 12, 14, are preferably secured in screw terminals which are part of the connector 38. The connector 38 may be a conventional connector such as is available from Omega Engineering, Inc., and may be attached to the tube 24 by a conventional tube clamp 40 or other known means. A presently preferred tube clamp 40 includes a bracket attached to the connector 38, secured to a compression fitting. Such a bracket and compression fitting are available from Omega Engineering, Inc.

As shown best in FIG. 2, the junction 16 is positioned adjacent one end 28 of the sheath 18. Positioning the junction 16 adjacent the sheath 18 assists the thermocouple 10 in resisting gas flows that would otherwise break the wires 12, 14 or separate the wires 12, 14 from one another at the junction 16. In one embodiment (not shown), the wires 12, 14 are not insulated and are positioned directly against the end 28 of the sheath 18. An embodiment wherein the wires 12, 14 are type C thermocouple wires placed directly against the sheath 18 is presently preferred for high pressure applications such as use in measuring a gas flow emerging from an inflator combustion chamber.

In the embodiment shown in FIG. 2, however, a gap 30 separates the junction 16 from the end 28 of the sheath 18. An embodiment having such a gap 30 is presently preferred for lower pressure applications such as use in measuring the gas output of an inflator where it enters a pressure tank or an air bag. The wires 12, 14 are covered with an insulator 32, such as polytetrafluoroethylene. Glass or ceramic beads having a wall thickness approximately the same as the polytetrafluoroethylene may also be employed. The insulator 32 is positioned against the end 28 of the sheath 18, thereby creating the gap 30. The width of the gap 30 is substantially equal to the thickness of the insulator 32.

A portion of the junction 16 extends beyond the wires 12, 14 into the path of the gas flow. Thus, even though the wires 12, 14 are secured in position against the end 28 of the sheath 18 and hence less susceptible to damage, the junction 16 is still sufficiently responsive to temperature changes to indicate trends.

As positioned in FIG. 2, the junction 16 resists gas flow pressures that would otherwise break either or both of the wires 12, 14, or separate the wires 12, 14 from one another at the junction 16. The junction 16 is configured to withstand placement within the gas flow from a combustion chamber for at least about fifty to about sixty milliseconds while the gas flow has a temperature from about 1000 up to about the manufacturer-specified melting point of the wires 12, 14 or about 2800 degrees Kelvin, whichever is least, and exerts a pressure against the junction 16 in the range of about 100 to about 2500 pounds per square inch. The junction 16 is considered to successfully withstand such placement if the wires 12, 14 are capable of forming a complete circuit during the test when electrically connected via the prongs (34, 36 in FIG. 1) to a working thermocouple thermometer.

In a presently preferred embodiment, the junction 16 repeatedly withstands placement within the gas flow for at least sixty milliseconds while the gas flow has a temperature from about 1000 to about 1200 degrees Kelvin and exerts a pressure against the junction 16 in the range from about 100 to about 2500 pounds per square inch. More rugged probes 10 may also be preferable, depending on conditions within the gas flow being measured and proximity of the probe 10 to the gas flow.

The junction 16 is configured to withstand placement within the gas flow emerging from a gas bag inflator into an air bag or test fixture pressure tank for at least about fifty to about sixty milliseconds while the gas flow has a temperature from about 300 to about 700 degrees Kelvin and exerts a pressure against the junction 16 of up to about 50 pounds per square inch. In a presently preferred embodiment, the junction 16 repeatedly withstands placement within the gas flow for at least sixty milliseconds while the gas flow has a temperature from about 300 to about 700 degrees Kelvin and exerts a pressure against the junction 16 of up to about five pounds per square inch.

The placement of the junction 16 shown in FIG. 2 also inhibits corrosion of the junction 16. The junction 16 is held above the flat end 28 of the sheath 18 by the insulator 32 on the wires 12, 14, so gas may pass freely through the gap 30 between the junction 16 and the sheath 18. The scrubbing action and flow of the gas about the junction 16 reduce the risk that corrosive compounds from the gas mixture will be deposited on the junction 16.

In summary, the present invention provides a rugged thermocouple that responds rapidly to temperature changes. The thermocouple junction is sufficiently rugged to withstand repeated exposure to the gas flow in a gas bag inflator. The body of the thermocouple is also reinforced by the steel tubing to withstand routine clamping. The thermocouple junction is exposed and comprises sufficiently small wires to respond rapidly to temperature changes, making the thermocouple useful in comparing gas generants by measuring the gas flow temperature at a plurality of distinct times and locations during gas bag inflator tests.

A thermocouple according to the teachings of the present invention responds to temperature changes rapidly enough and accurately enough to measure gas bag ignitor gas flow temperatures about once per millisecond. Such a thermocouple does not provide fully accurate quantitative measurements, as the absolute values measured with the thermocouple are generally lower than the actual gas temperature. Also, the measured curve lags behind the actual temperature curve by a delay of up to about five milliseconds. However, the thermocouple is useful in comparing gas generants to one another because the qualitative characteristics of the measured curves are accurate and reproducible. Also, the delay after which a qualitative characteristic such as an upward trend becomes apparent in the measured curve using the thermocouple of the present invention may be as small as about one millisecond.

The invention may be embodied in other specific forms without departing from its spirit or essential characteristics. The described embodiments are to be considered in all respects only as illustrative and not restrictive. Any explanations provided herein of the scientific principles employed in the present invention are illustrative only. The scope of the invention is, therefore, indicated by the appended claims rather than by the foregoing description. All changes which come within the meaning and range of equivalency of the claims are to be embraced within their scope.

What is claimed and desired to be secured by patent is:

1. A thermocouple for use in measuring the temperature of a gas flow, comprising:
   a first wire formed of a first metal;
   a second wire formed of a second metal different from said first metal, said second wire electrically joined to said first wire at an exposed twist-welded junction, each of said wires having a diameter near said junction no greater than about ten thousandths of an inch, each of said wires coated with an electrical insulator, said junction being free of said electrical insulator; and
   an electrically insulating sheath substantially surrounding said wires adjacent said junction for maintaining said wires in separation from one another except at said junction, each of said insulators of said wires being positioned against an end of said sheath thereby creating a gap between said junction and said end of said sheath having a width substantially equal to the width of said insulator;
   wherein said junction is configured and positioned relative to said sheath to withstand placement within the gas flow for at least fifty milliseconds while the gas flow has a temperature of at least 300 degrees Kelvin and exerts a pressure against said junction of up to about five pounds per square inch.

2. The thermocouple of claim 1, wherein said junction is configured and positioned relative to said sheath to withstand placement within the gas flow for at least fifty milliseconds while the gas flow has a temperature up to about 700 degrees Kelvin and exerts a pressure against said junction of up to about five pounds per square inch.

3. The thermocouple of claim 1, wherein said junction is configured and positioned relative to said sheath to withstand placement within the gas flow for at least fifty milliseconds while the gas flow has a temperature of at least about 300 degrees Kelvin and exerts a pressure against said junction of up to about fifty pounds per square inch.

4. The thermocouple of claim 1, wherein said junction is configured and positioned relative to said sheath to withstand placement within the gas flow for at least fifty milliseconds while the gas flow has a temperature up to about 700 degrees Kelvin and exerts a pressure against said junction of up to about fifty pounds per square inch.

5. The thermocouple of claim 1, wherein said junction is configured and positioned relative to said sheath to withstand placement within the gas flow for at least fifty milliseconds while the gas flow has a temperature of at least 1000 degrees Kelvin and exerts a pressure against said junction of at least 100 pounds per square inch.

6. The thermocouple of claim 1, wherein said junction is configured and positioned relative to said sheath to withstand placement within the gas flow for at least fifty milliseconds while the gas flow has a temperature in the range from about 1000 degrees Kelvin to about 1200 degrees Kelvin and exerts a pressure against said junction of at least 100 pounds per square inch.

7. The thermocouple of claim 1, wherein said junction is configured and positioned relative to said sheath to withstand placement within the gas flow for at least fifty milliseconds while the gas flow has a temperature of at least 1000 degrees Kelvin and exerts a pressure against said junction in the range from about 100 pounds per square inch to about 2500 pounds per square inch.

8. The thermocouple of claim 1, wherein said junction is configured and positioned relative to said sheath to withstand placement within the gas flow for at least fifty milliseconds while the gas flow has a temperature of up to about the melting point of said wires and exerts a pressure against said junction of up to about 2500 pounds per square inch.

9. The thermocouple of claim 1 wherein said electrical insulator comprises polytetrafluoroethylene.

10. The thermocouple of claim 1, further comprising a rigid tube substantially surrounding said sheath for structurally reinforcing said sheath, said tube secured to said sheath in at least one location.

11. The thermocouple of claim 10, wherein said rigid tube comprises a stainless steel tube.

12. The thermocouple of claim 10, further comprising a connector having a first metal prong in direct electrical communication with said first wire and having a second metal prong in direct electrical communication with said second wire, said connector secured to said tube.

13. The thermocouple of claim 1, wherein each of said wires has a diameter near said junction no greater than about five thousandths of an inch.

14. The thermocouple of claim 1, wherein each of said wires has a diameter near said junction no greater than about three thousandths of an inch.

15. The thermocouple of claim 1, wherein said sheath is rigid.

16. The thermocouple of claim 15, wherein said sheath comprises a ceramic material.

* * * * *